United States Patent
Yun et al.

(10) Patent No.: US 6,449,674 B1
(45) Date of Patent: Sep. 10, 2002

(54) INTERNAL COMMAND SIGNAL GENERATOR AND METHOD THEREFOR

(75) Inventors: Mi Kyung Yun, Taejeon; Jong Hee Han, Sungnam-shi, both of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/471,486

(22) Filed: Dec. 23, 1999

(30) Foreign Application Priority Data

Dec. 24, 1998 (KR) ............................................. 98-58633

(51) Int. Cl.[7] ..................... G06F 13/24; G06F 12/00; G11C 8/00
(52) U.S. Cl. ..................... 710/260; 710/52; 711/100; 365/230.08; 365/233
(58) Field of Search ............... 710/260, 52; 365/189.05, 365/230.08, 230.06, 233; 711/100, 167; 370/503

(56) References Cited

U.S. PATENT DOCUMENTS

| | | | |
|---|---|---|---|
| 5,493,241 A | | 2/1996 | Landry et al. |
| 5,963,483 A | * | 10/1999 | Yahata et al. |
| 6,163,501 A | * | 12/2000 | Ohshima et al. |
| 6,304,510 B1 | * | 10/2001 | Nobunaga et al. |
| 6,366,524 B1 | * | 4/2002 | Abedifard |

FOREIGN PATENT DOCUMENTS

| | | |
|---|---|---|
| EP | 0773549 | 5/1997 |
| GB | 2302974 | 2/1997 |
| GB | 2304435 | 3/1997 |

* cited by examiner

Primary Examiner—Gopal C. Ray
(74) Attorney, Agent, or Firm—Jacobson Holman, PLLC

(57) ABSTRACT

An internal command signal generator and a method therefor generate internal command signal for an internal circuit operation after receiving external control signal in a synchronous memory device. Particularly, the internal command signal generator and a method therefor previously decode external input control signals for generating an internal command signal during a time required to generate an internal clock signal by buffering the external clock signal, thus produce an internal command signal, and synchronize the internal command signal to the internal clock signal. As a result, all time required to a decoding operation is reduced so that a data access time is greatly reduced.

4 Claims, 4 Drawing Sheets

INTERNAL COMMAND SIGNAL GENERATOR AND METHOD THEREFOR

BACKGROUND OF THE INVENTION

1. Field of the Invention

The present invention relates to an internal command signal generator and a method therefor, which generate internal command signal for an internal circuit operation after receiving external control signal in a synchronous memory device. More particularly, it relates to an internal command signal generator and a method therefor, which perform a decoding of internal command signal during a delay time required to ensure a setup and hold time margin about internal clock signal, thus greatly reduce a data access time and embody a high-speed synchronous memory element.

2. Description of the Prior Art

Generally, a computer system is comprised of a central processing unit (CPU), peripheral Input/Output unit, and memory unit. A main supply source of a main memory unit of computer being presently used has a plurality of requirements (that is, a low price per a bit, a response characteristic suitably responding to a high-speed operation of CPU, and a high integration to reduce a capacity of entire system). As a result, to satisfy the above requirements, the main supply source is being changed to a synchronous dynamic random access memory (DRAM).

The synchronous DRAM is synchronized to an edge of a main 30 clock signal used in computer CPU and peripheral chip-set, and thus performs an input/output operation. A memory cell of the synchronous DRAM is comprised of a matrix structure of $2^N$(Row)×$2^M$(Column) in the same manner as a general DRAM.

Therefore, in order to read a stored data of the synchronous DRAM, N row addresses are firstly input by a row command signal, and are then decoded. In this way, a desired one row (i.e., word line) among row addresses of $2^N$ is selected and then enabled.

Thereafter, M external input column addresses are decoded by a column command signal in order to select one bit line among column addresses of $2^M$. Input/output operation of a selected bit line data according to a read command or a write command is achieved.

At this time, a time required to generate a data from an external clock signal(ext_clk) wherein external control signals (i.e., /RAS, /CAS, /WE . . . ) are input to generate the column command signal is called a data access time (tAA). Lowering the data access time (tAA) is a very important matter in a high frequency operation.

FIG. 1 is a block diagram of a conventional internal command signal generator, and shows a case that an internal command signal is a column command signal. Hereinafter, a discussion focus is placed on a generation of internal column command signal.

As shown in FIG. 1, in order to generate a command signal for an internal operation control of a memory element, the conventional internal command signal generator includes: a plurality of input buffer units 10 which buffer each of a plurality of external control signals (/RAS, /CAS, /WE. . . ) of TTL level with a CMOS level signal suitable to an internal circuit operation; a clock buffer unit 20 for generating an internal clock signal (int_clk) by buffering an external clock signal (ext_clk); a plurality of delay units 30 for delaying the external control signals generated from the input buffer units 10 in order to ensure a setup and hold time margin about the internal clock signal (int_clk); a plurality of latch units 40 which synchronize each control signal delayed by the delay units 30 to the internal clock signal (int_clk) generated from the clock buffer unit 20, and generate pulse signals (in_pulse_1 ~in_pulse_n) internally used; and a command decoder unit 50 for receiving each internal pulse signal (in_pulse_1 ~in_pulse_n) generated from the latch units 40, and generating internal column command signals (casatv, icasatv).

FIG. 2 illustrates an operation timing diagram of the conventional internal command signal generator shown in FIG. 1.

As shown in FIG. 2(c), external input command control signals (/RAS,/CAS,/WE. . . ) of TTL level pass through the input buffer units 10, and are then changed to a buffering signal of CMOS level as shown in FIG. 2(d). The buffering signal is synchronized to the internal clock signal (int_clk). Therefore, an internal pulse signal (in_pulse) shown in FIG. 2(e) is generated.

At this time, the buffering signal shown in FIG. 2(d) has a predetermined delay time (Dt1) for ensuring a setup and hold time margin, prior to a synchronization about the internal clock signal (int_clk) shown in FIG. 2(b).

Accordingly, internal pulse signal (in_pulse) shown in FIG. 2(e) becomes generated after the delay time (Dt1). Then, the command decoder unit 50 combines the internal pulse signals, thereby generating CAS activation control command signal (casatv) being used as an internal column command signal.

In addition, the command signal generator of FIG. 1 receives the internal clock signal (int_clk) under the condition that a signal (yburst_flag) that the internal column comand signal is latched by a burst controller (not shown) is enabled, thereby generating another internal column command signal (icasatv). If the internal column command signal generator receives two internal column command signals (casatv, icasatv), a column operation starts.

However, the aforementioned conventional internal column command signal generator which generates an internal command signal by a combination of internal pulse signals (in_pulse_1 ~in_pulse_n) generated by a synchronization to the internal clock signal (int_clk) has two kinds of time loss problems.

Firstly, before a control signal buffered by the input buffer is synchronized to the internal clock signal (int_clk), a predetermined delay time is required to ensure the setup and hold time margin about the internal clock signal (int_clk).

Secondly, during a read operation, if a read interrupt command is input when an internal column operation is performed by receiving the internal column command signals (casatv, icasatv), the internal column command signal (icasatv) should be disabled to prevent an internal operation. Accordingly, a disable path is added to a generation part of the internal column command signal (icasatv).

An interrupt signal for preventing a problem that the internal column command signal (icasatv) is generated after the CAS activation control command signal (casatv) is additionally made, so that an enable operation of a column address predecoding control signal (ypc) is prevented. In this case, a time margin about the interrupt signal should be considered.

In conclusion, according to the conventional internal command signal generator and method thereof, a data access time becomes increased due to an additional delay time, a high-speed operation of a synchronous memory element becomes limited.

SUMMARY OF THE INVENTION

Accordingly, the present invention is directed to an internal command signal generator and a method therefor that substantially obviate one or more of the problems due to limitations and disadvantages of the related art.

It is an objective of the present invention to provide an internal command signal generator and a method therefor which greatly reduce a generation time of internal command signal by reducing a data access time, thereby achieving a high-speed operation.

To achieve the above objective, an internal command signal generator according to the present invention includes: a first buffer unit for buffering an external input command control signal with a signal level suitable to an internal circuit operation; a second buffer unit for buffering an external clock signal with an internal clock signal suitable to an internal circuit operation; a delay unit for delaying an output signal of the first buffer unit by a predetermined time in order to ensure a setup and hold time margin about the internal clock signal; a command decoder unit for receiving buffering signals generated from the first buffer unit, previously performing a decoding operation by combining the buffering signals during a constant delay time determined by the delay unit, and generating an internal command signal; and a latch unit for latching an internal command signal generated from the command decoder unit, and then synchronizing the internal command signal to the internal clock signal generated from the second buffer unit.

The command decoder unit additionally decodes a control signal in order to generate an interrupt command.

A method for generating an internal command signal according to the present invention includes the steps of: (a) buffering an external input command control signal with a signal level suitable to an internal circuit operation; (b) receiving the command control signal buffered in the step (a) as an input, decoding the command control signal in order to generate an internal command signal, and particularly performing a decoding operation during a predetermined delay time required to ensure a setup and hold time margin about an internal clock signal; and (c) latching the internal command signal generated from the step (b), and synchronizing the internal command signal to the internal clock signal.

The step (b) includes the step of additionally decoding a control signal in order to generate an interrupt command.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

Figure 1:
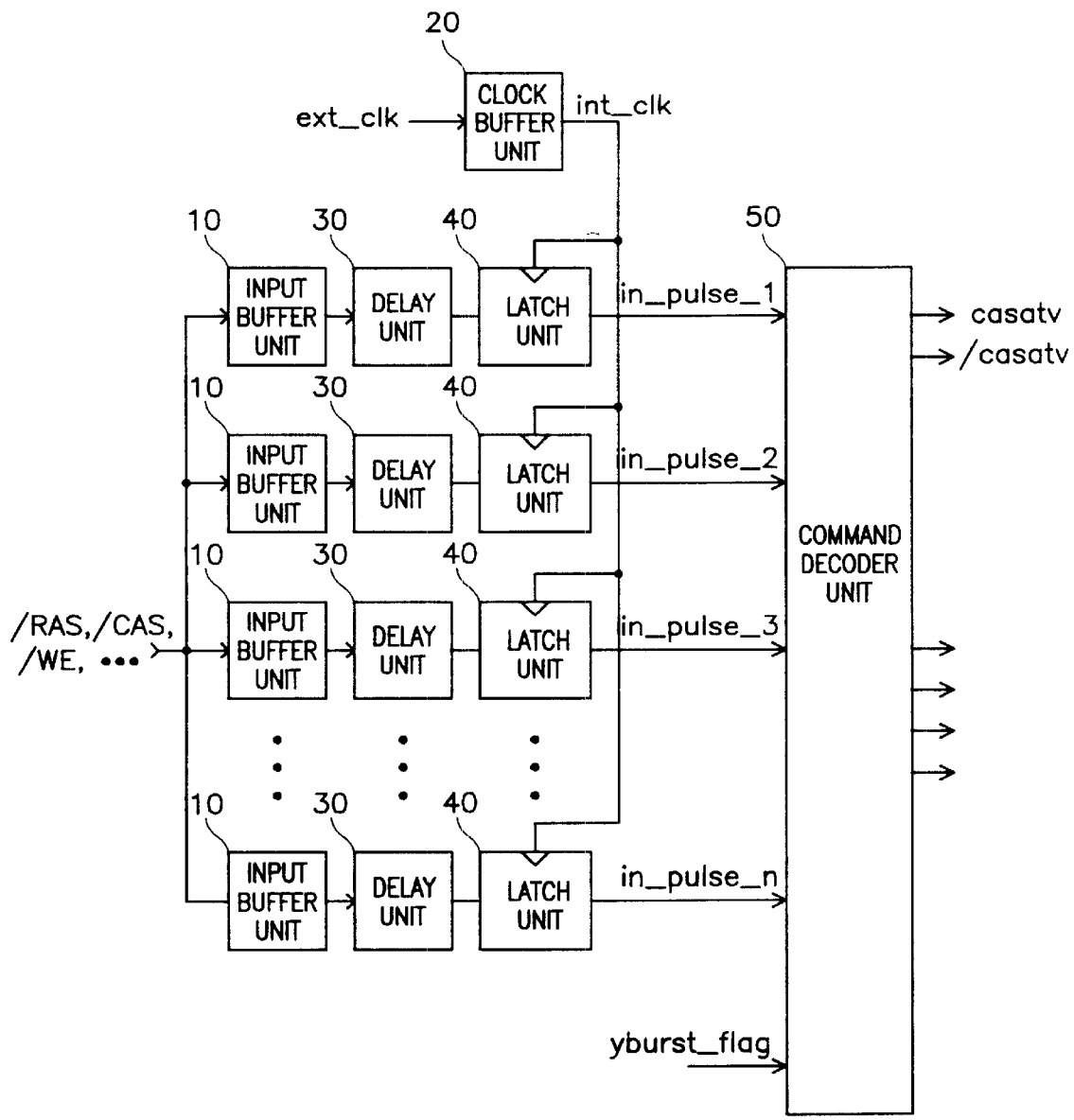
FIG. 1 illustrates a block diagram of a conventional internal command signal generator.
Figure 2:
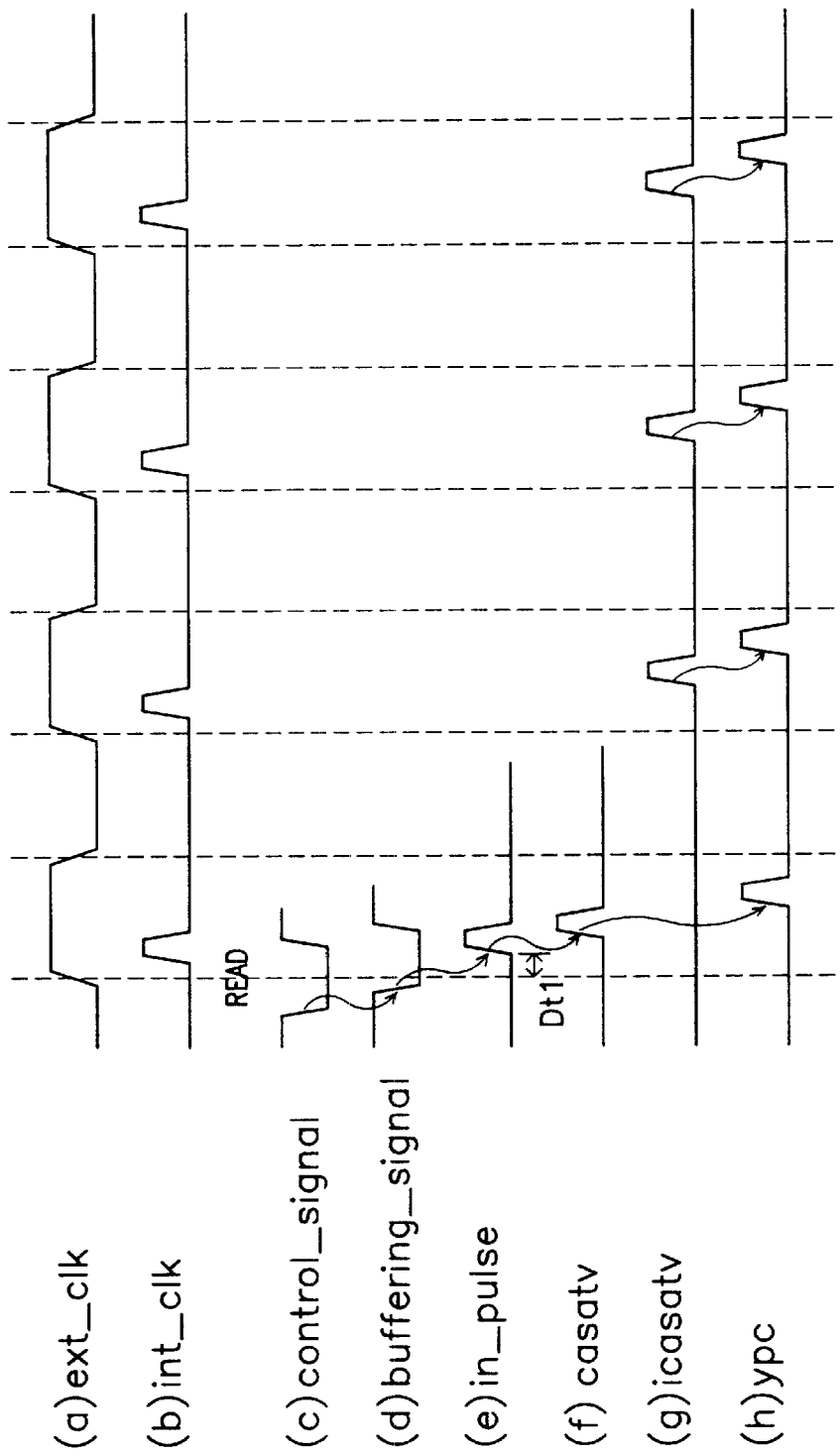
FIG. 2 illustrates an operation timing diagram of the conventional internal command signal generator shown in FIG. 1.
Figure 3:
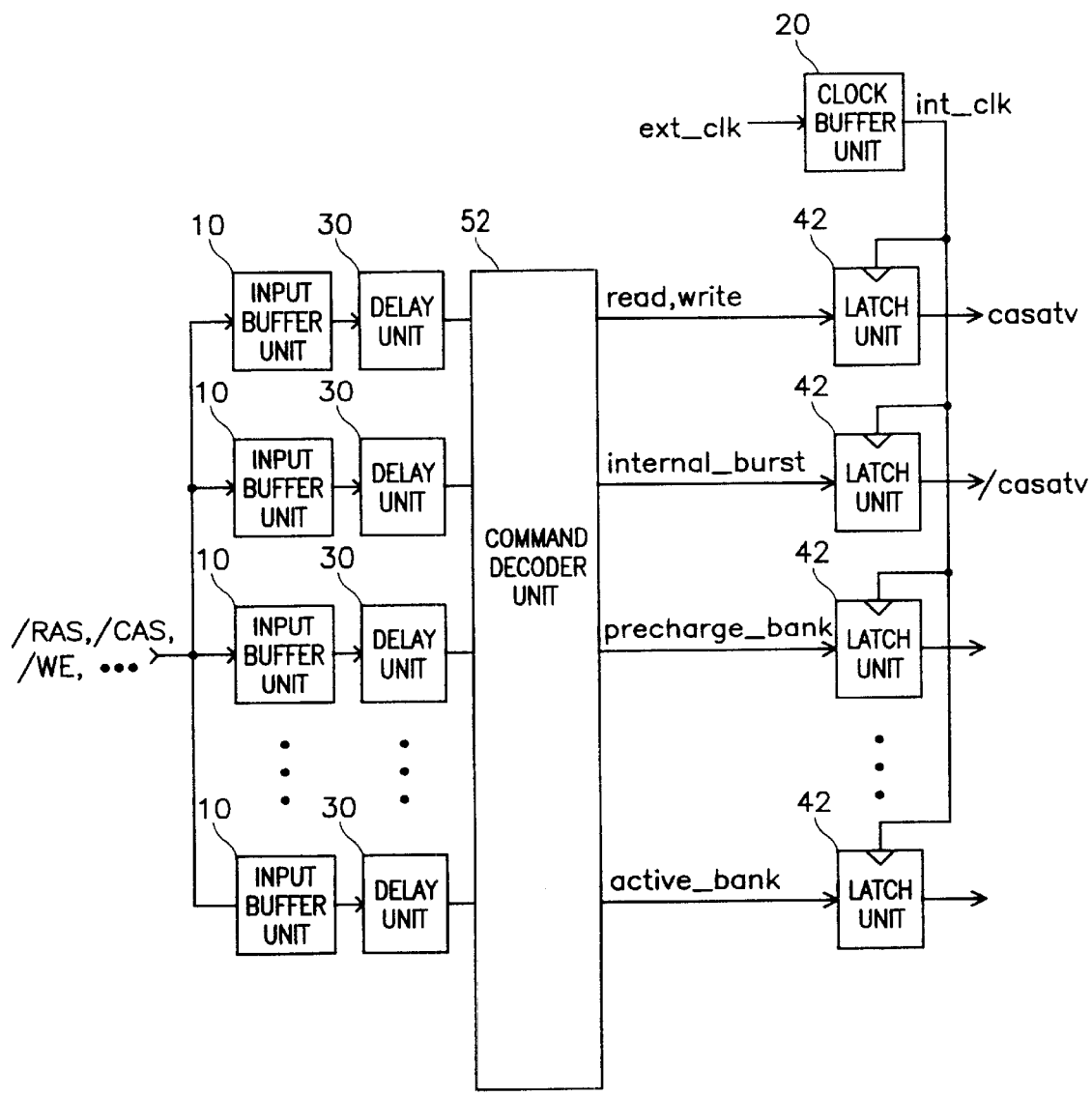
FIG. 3 illustrates a block diagram of an internal command signal generator according to the present invention.

FIG. 3 illustrates a block diagram of an internal command signal generator according to the present invention. In FIG. 3, an internal command signal is depicted as a column command signal.

The internal command column command signal generator shown in FIG. 3 includes: a plurality of input buffer units 10 which buffer each of a plurality of external control signals (/RAS, /CAS, /WE. . . ) of TTL level with a CMOS level signal suitable to an internal circuit operation; a clock buffer unit 20 for generating an internal clock signal (int_clk) by buffering an external clock signal (ext_clk); a plurality of delay units 30 for delaying the external control signals generated from the input buffer units 10 by a predetermined time in order to ensure a setup and hold time margin about the internal clock signal (int_clk); a command decoder 52 for receiving a control signal generated from the input buffer units 10, and previously performing a decoding operation during a predetermined delay time determined by the delay units 30; and latch units 42 for latching an internal command signal decoded by the command decoder unit 52, and synchronizing the internal command signal to the internal clock signal (int_clk).

During a time required to make the external clock signal (ext_clk) generate the internal clock signal (int_clk) after passing through the clock buffer unit 20, the internal command signal generator according to the present invention previously decodes external input control signals for a generation of an internal command. The internal command signal generator immediately generates the internal command signal previously decoded by being synchronized to a generation time point of the internal clock signal (int_clk).

As a result, all time required to a decoding of a control is signal can be reduced.

Figure 4:
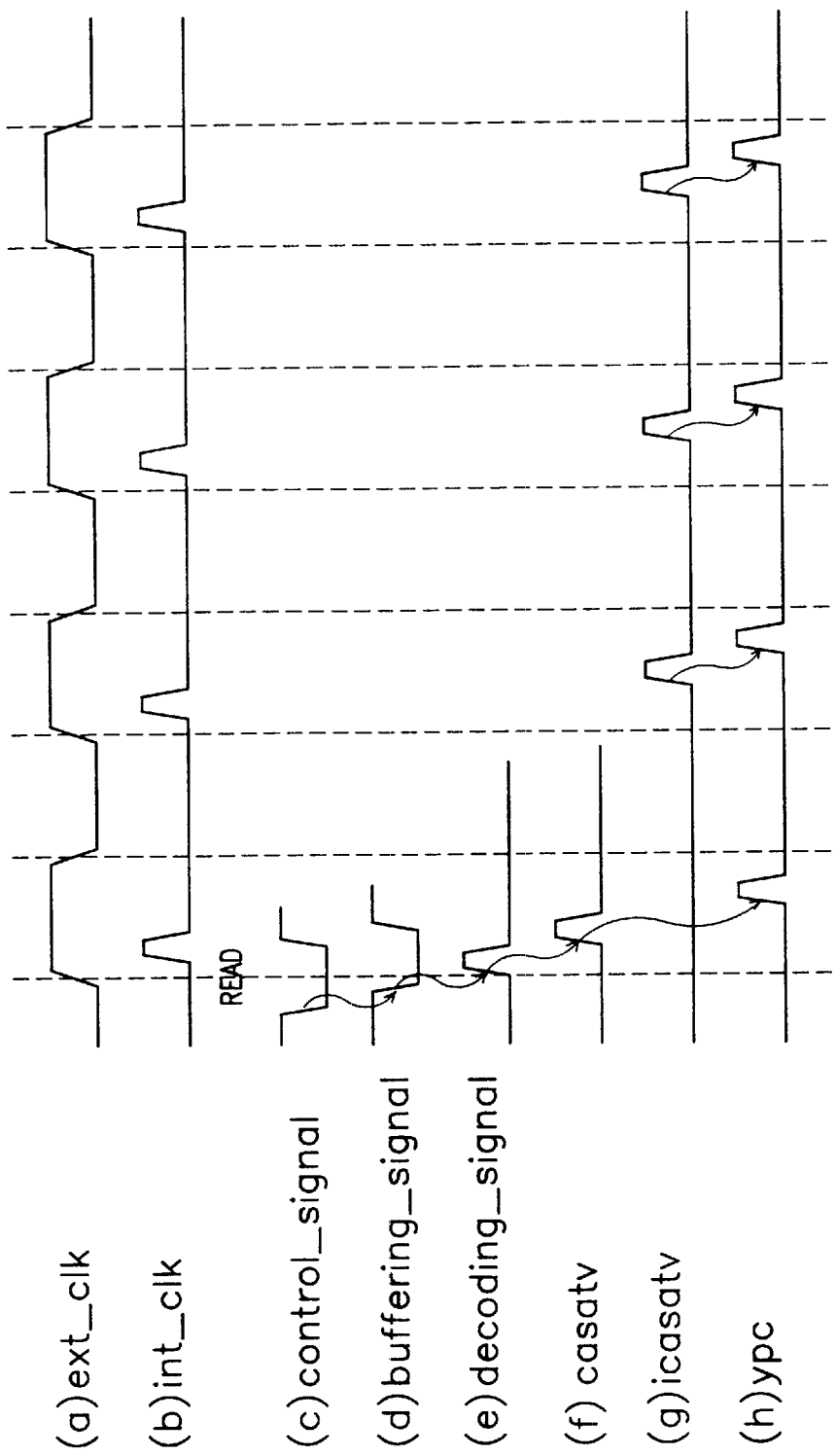
FIG. 4 illustrates an operation timing diagram of the internal command signal generator shown in FIG. 3.

FIG. 4 illustrates an operation timing diagram of the internal command signal generator shown in FIG. 3.

A main principle of the present invention is that the internal command signal is decoded for a delay time required to ensure a setup and hold time margin about the internal clock signal, before an external command control signal is synchronized to an internal clock signal after the external command control signal is buffered.

The clock buffer 20 receives an external clock signal (ext_clk) as shown in FIG. 4(a), performs a buffering operation for a constant time, and thus generates an internal clock signal (int_clk) shown in FIG. 4(b).

In the meantime, as shown in FIG. 4(c), an external input control signal for generating an internal command signal for an internal operation control of an element passes through the input buffer units 10, and is then buffered as shown in FIG. 4(d). At the same time, the buffered signal is input to the command decoder unit 52, a decoding operation is previously performed before the clock buffer unit 20 generates the internal clock signal (int_clk), thereby generating a decoding signal as shown in FIG. 4(e).

After the external control signal is previously decoded before generating the internal clock signal (int_clk), if the internal clock signal (int_clk) is generated from the clock buffer unit 20, the external control signal is synchronized to the internal clock signal (int_clk), thereby immediately generating the internal column command signal (casatv) being CAS activation control command signal. Accordingly, an additional time for performing a control signal decoding is not needed.

In addition, when there is an interrupt command about a command performing an element's internal operation, a decoding operation of a control signal for a generation of the interrupt command can be also performed in the command decoder unit 52.

Therefore, regarding another internal column command signal (icasatv) which is generated by receiving the internal clock signal (int_clk) under the condition that a signal (yburst_flag) that the CAS activation control command signal (casatv) is latched by a burst controller (not shown) is enabled, the internal command signal generator according to the present invention synchronizes the control signals to an internal clock signal in consideration of an interrupt operation after decoding the control signals. Therefore, an additional interrupt command is not needed to a decoding operation under a read interrupt condition, and there is no need to consider a time margin in a column pre-decoding unit (not shown) connected to a rear part. As described above, since the internal command signal generator according to the present invention can reduce all time required to decoding of a control signal applied for an internal command generation, the data access time can be greatly reduced and a circuit operation of a high-speed can be embodied.

In addition, when a disabled internal column command signal is required because an interrupt command occurs during a read operation, there is no need to add a delay time considering an additional time margin about the interrupt command.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. An internal command signal generator, comprising:
    a first buffer means for buffering an external input command control signal with a signal level suitable to an internal circuit operation;
    a second buffer means for buffering an external clock signal with an internal clock signal suitable to an internal circuit operation;
    a delay means for delaying an output signal of the first buffer means by a predetermined time in order to ensure a setup and hold time margin about the internal clock signal;
    a command decoder means for receiving buffering signals generated from the first buffer means, previously performing a decoding operation by combining the buffering signals during a constant delay time determined by the delay means, and generating an internal command signal; and
    a latch means for latching an internal command signal generated from the command decoder means, and then synchronizing the internal command signal to the internal clock signal generated from the second buffer means.

2. An internal command signal generator according to claim 1, wherein the command decoder means additionally decodes a control signal in order to generate an interrupt command.

3. A method for generating an internal command signal, comprising the steps of:
    (a) buffering an external input command control signal with a signal level suitable to an internal circuit operation;
    (b) receiving the command control signal buffered in the step (a), decoding the command control signal in order to generate an internal command signal, and particularly performing a decoding operation during a predetermined delay time required to ensure a setup and hold time margin about an internal clock signal; and
    (c) latching the internal command signal generated from the step (b), and synchronizing the internal command signal to the internal clock signal.

4. A method for generating an internal command signal according to claim 3, wherein the step (b) includes:
    the step of additionally decoding a control signal in order to generate an interrupt command.

* * * * *